United States Patent [19]

Hoshino et al.

[11] Patent Number: 5,589,425
[45] Date of Patent: Dec. 31, 1996

[54] PROCESS OF SELECTIVE AREA CHEMICAL VAPOR DEPOSITION OF METAL FILMS

[75] Inventors: Masataka Hoshino; Nobuhiro Misawa, both of Kawasaki, Japan

[73] Assignee: Fijitsu Limited, Kanagawa, Japan

[21] Appl. No.: 350,036

[22] Filed: Nov. 29, 1994

[30] Foreign Application Priority Data

Feb. 9, 1994 [JP] Japan .................................. 6-035159

[51] Int. Cl.⁶ ................................................. C23C 16/00
[52] U.S. Cl. .......................... 427/250; 427/253; 427/287; 427/124; 427/125
[58] Field of Search .................................... 427/250, 125, 427/124, 287, 253

[56] References Cited

U.S. PATENT DOCUMENTS 4,888,204   12/1989   Tutt et al. ................................ 427/584
5,316,796    5/1994   Awaya et al. ............................ 427/252

OTHER PUBLICATIONS

P. F. Seidler et al., "Low Temperature Selective Area Chemical Vapor Deposition of Gold Films: Growth and Characterization", Mat. Res. Soc. Symp. Proc. vol. 282, 1993, pp. 359–364.

*Primary Examiner*—Roy V. King
*Attorney, Agent, or Firm*—Armstrong, Westerman, Hattori, McLeland & Naughton

[57] ABSTRACT

A process of growing a film of a metal on a substrate in a selective area thereof by chemical vapor deposition, the process comprising the steps of: preparing a source having a molecule comprising a metal and a radical; providing a substrate having a selective area made of a first substance which is unreactive with the radical and the other area made of copper which is reactive with the radical; and supplying the source onto the substrate held at a film growing temperature to induce a reaction on the substrate, such that, in the selective area, the molecule of the source is bonded to the first substance and decomposed to precipitate the metal on the first substance while, in the other area, the radical of the molecule is combined with the copper to cover the other area of the substrate with a coating which is unreactive with the molecule of the source.

5 Claims, 9 Drawing Sheets

PROCESS OF SELECTIVE AREA CHEMICAL VAPOR DEPOSITION OF METAL FILMS

BACKGROUND OF THE INVENTION

1. Field of the Invention

The present invention relates to a process of selective area chemical vapor deposition of metal film.

2. Description of the Related Art

It has recently been desired to establish a process of selective chemical vapor deposition of Au, Pt or other metals having low electrical resistivity, good corrosion resistance, and X-ray impermeability to advantageously provide conductor wirings of integrated circuits, contact holes of multiple layered conductor wirings, and masks for X-ray exposure.

Paul F. Seidler et al., in "Low Temperature Selective Chemical Vapor Deposition of Gold Films: Growth and Characterization", 1992 Mat. Res. Soc. Symp. Proc., proposed a process of selective chemical vapor deposition of a gold film using a catalytic reaction of a selective area in which the gold film is formed.

FIG. 1 clarifies the proposed conventional process of selective chemical vapor deposition of gold films, in which the axis of abscissa indicates the film growing temperature and the axis of ordinate indicates the film growth rate.

The conventional process of selective chemical vapor deposition of gold films provides selectivity between a Au substrate and an $SiO_2$ or other insulating substrate or selectively between a Cu substrate and an $SiO_2$ or other insulating substrate at film growing temperatures in the range of 30° to 109° C., in which the growth rate of gold film is merely 30 Å/min at most and is not suitable for practical applications. Thus, it is not practical to grow a film of gold or other inactive metals by conventional chemical vapor deposition, in which a source is decomposed by a catalyst provided in a selective area to precipitate the metal, because of the inefficiency due to the small growth rate such as 30 Å/min at most as recited above.

This is because the chemical vapor deposition of Au or other inactive metals using a process providing high selectivity requires that the reaction rate be small even in the nonselective area (i.e., the area other than the selective area), which in turn requires that the growth rate also be small in the selective area.

SUMMARY OF THE INVENTION

The object of the present invention is to provide a process of selective area chemical vapor deposition of metal films, which simultaneously ensures a high growth rate and a high selectivity ratio between different substrates.

To achieve the object according to the present invention, there is provided a process of growing a film of a metal on a substrate in a selective area thereof by chemical vapor deposition, the process comprising the steps of:

preparing a source having a molecule comprising a metal and a radical;

providing a substrate having a selective area made of a first substance which is unreactive with the radical and a nonselective area (i.e., the area other than the selective area) made of a second substance which is reactive with the radical; and supplying the source onto the substrate held at a film growing temperature to induce a reaction on the substrate, such that, in the selective area, the molecule of the source is bonded to the first substance and decomposed to precipitate the metal on the first substance while, in the nonselective area, the radical of the molecule is combined with the second substance to cover the other area of the substrate with a coating which is hard to bond to the molecule of the source.

Typically, the metal is selected from gold and platinum.

Preferably, the radical is hexafluoroacetylacetonate radical ($C_5HF_6O_2$).

When the metal is gold, the source preferably consists of dimethyl gold hexafluoroacetylacetonate (($CH_3)_2Au(C_5HF_6O_2)$).

When the metal is platinum, the source preferably consists of platinum dihexafluoroacetylacetonate ($Pt(C_5HF_6O_2)_2$).

The first substance, which forms the selective area of the substrate, is advantageously selected from the group consisting of gold (Au), tungsten (W), platinum (Pt), titanium (Ti), titanium nitride (TIN), silicon nitride (SIN), and silicon oxide ($SiO_2$).

Typically, the second substance, which forms the nonselective area, is copper (Cu).

DESCRIPTION OF THE PREFERRED EMBODIMENTS

A gold (Au) film is grown by a process of selective area chemical vapor deposition according to the present invention based on the following principle.

Dimethyl gold hexafluoroacetylacetonate (DMAu(hfa)) is supplied onto a substrate as a source of the gold film and is brought into contact with an nonselective area made of Cu or other substance, which is reactive with the hfa radical, so that the hfa radical reacts with the Cu to form Cu(hfa) which covers the Cu to prevent the subsequent feed of DMAu(hfa) from bonding to the Cu and thereby prevent the precipitation of Au in the nonselective area, whereas the remaining portion of the DMAu(hfa) is brought into contact with a selective area made of a substance such as Au, W, Pt, Ti, TiN, SiN, or $SiO_2$, which is unreactive with the hfa radical, so that the DMAu(hfa) is bonded to the Au and decomposed to precipitate Au in the selective area.

The reaction between the DMAu(hfa) and the substrate significantly varies when the reaction temperature varies.

Figure 1:
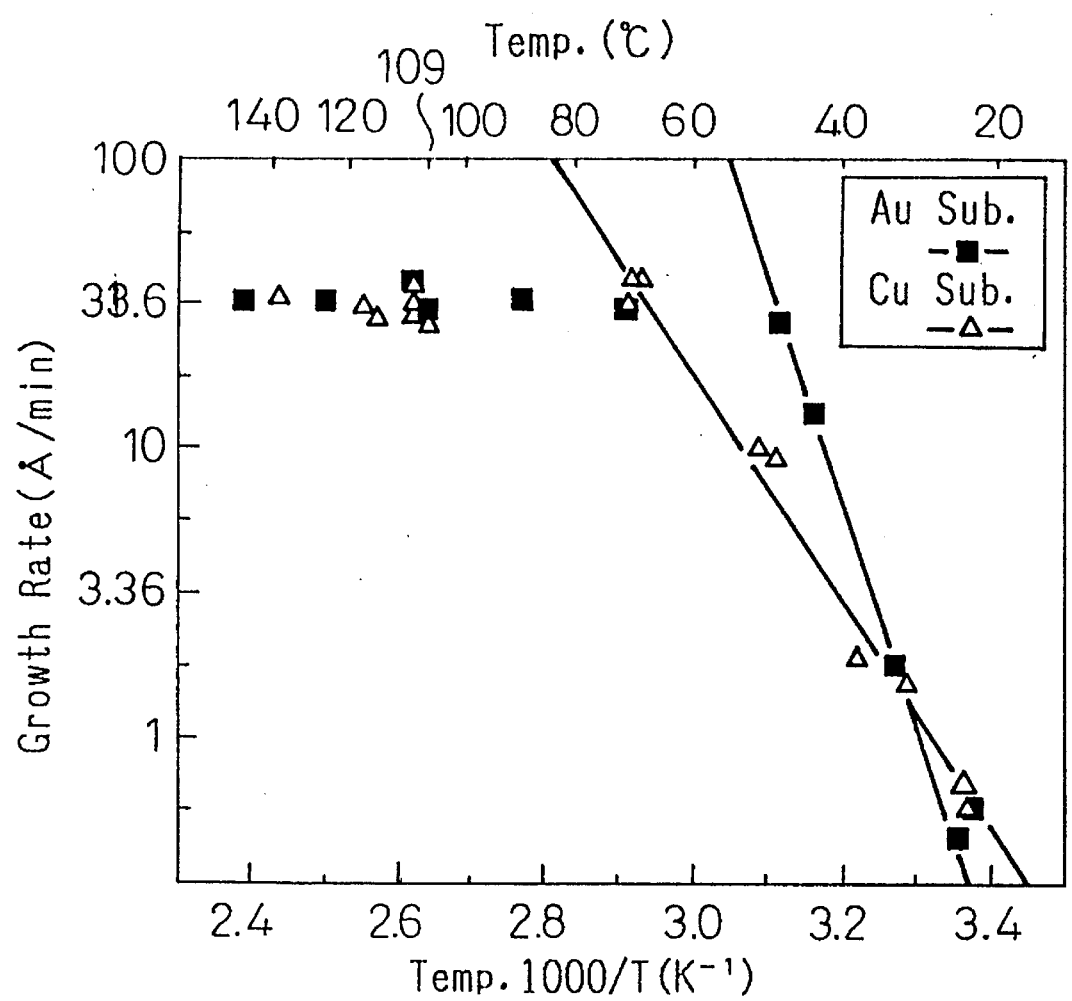
FIG. 1 is a graph clarifying the conventional process of selective chemical vapor deposition of of gold films, in which the axis of abscissa indicates the film growing temperature and the axis of ordinate indicates the film growth rate.
Figure 2:
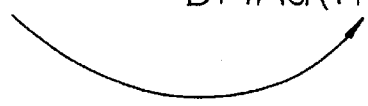
FIG. 2 shows the principle of the process of selective area chemical vapor deposition of metal films according to the present invention, in which cases A and B use high and low growth temperatures, respectively.

FIG. 2 shows the principle of the process of selective area chemical vapor deposition of metal films according to the present invention, in which cases A and B use high and low growth temperatures, respectively.

Case A shows a reaction model of growing a gold film on a copper substrate held at a film growing temperature of higher than 200° C. according to the present invention, at which temperature the hfa radical of the DMAu(hfa) reacts with the copper substrate to form a coating covering the copper substrate in phase 1 and, in phase 2, the hfa coating on the copper substrate prevents the subsequent feed of DMAu(hfa) from bonding to the copper, thereby preventing the precipitation of gold on the copper substrate.

Case B shows a reaction model of growing a gold film on a copper substrate held at a film growing temperature of lower than 200° C. according to the present invention, at which temperature the DMAu(hfa) bonds to the copper substrate in phase 1 and is then decomposed there to precipitate gold on the copper substrate in phase 2.

EXAMPLE

A working example of the process according to the present invention will be described below.

Figure 3:
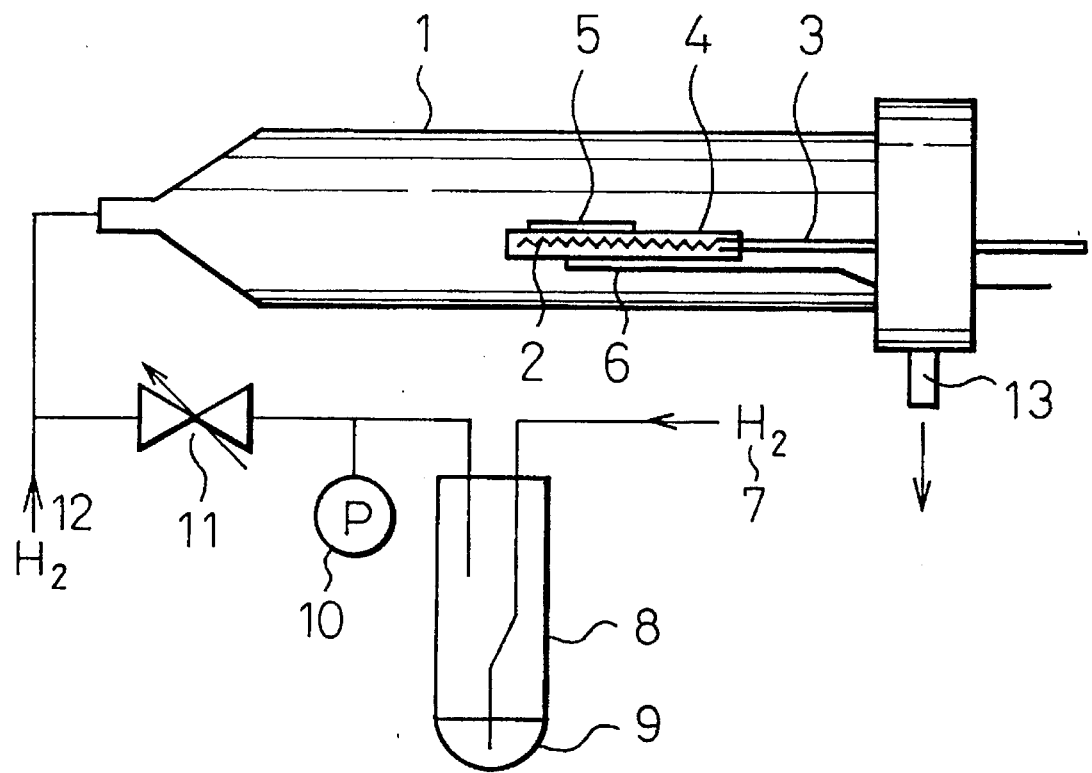
FIG. 3 shows an arrangement suitable for carrying out the process of selective area chemical vapor deposition of metal films according to the present invention.

FIG. 3 shows an arrangement for carrying out the process of selective area chemical vapor deposition of metal films according to the present invention.

The arrangement is composed of a reaction chamber 1, a heater 2, a heater electrode 3, a susceptor 4, a wafer 5, a thermocouple 6, a carrier gas inlet 7, a bubbler 8, a source 9, a pressure gauge 10, a variable conductance valve 11, a diluting gas inlet 12, and a gas outlet 13.

By using this arrangement, a gold film is typically grown on a substrate in the following manner.

The wafer 5, prepared as a substrate on which a gold film is to be grown, is placed on the susceptor 4 provided with the heater 2, the thermocouple 6, and the heater electrode 3 and the susceptor 4 with the wafer 5 placed thereon is inserted in the middle of the reaction chamber 1. The source material DMAu(hfa) contained in the bubbler 8 is bubbled with a flow of $H_2$ gas introduced at a flow rate of 200 sccm through the carrier gas inlet 7 and the DMAu(hfa) gas, being carried by the $H_2$ gas, is discharged from the bubbler 8. The pressure of this gas mixture is measured by the pressure gauge 10 and is adjusted to 37 Torr in terms of the pressure at 20° C. and the flow rate is adjusted by the variable conductance valve 11. The gas mixture joins another flow of $H_2$ gas, which is introduced at a flow rate of 50 sccm through the diluting gas inlet 12, and is then introduced into the reaction chamber 1. The gas pressure within the chamber 12 is adjusted to 2.3 Torr. The exhausted gas is discharged through the gas outlet 13.

Figure 4:
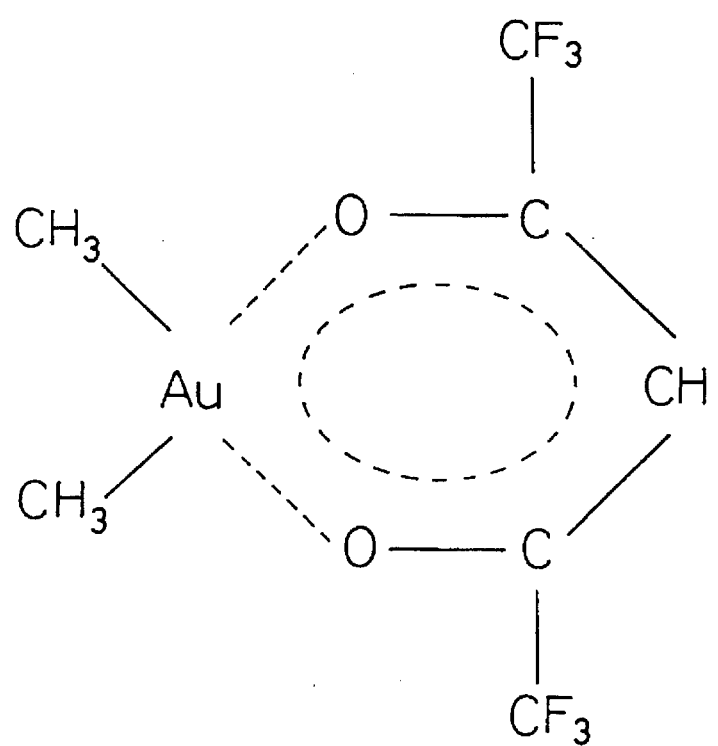
FIG. 4 shows the molecular structure of the source DMAu(hfa), i.e., dimethyl gold hexafluoroacetylacetonate, which is advantageously used as a source in a process of growing a gold film by selective area chemical vapor deposition according to the present invention.

FIG. 4 shows the molecular structure of the source DMAu(hfa), i.e., dimethyl gold hexafluoroacetylacetonate, which is advantageously used as a source in a process of growing a gold film by selective area chemical vapor deposition according to the present invention. DMAu(hfa) has a vapor pressure of 400 mTorr at 24° C.

Figure 5:
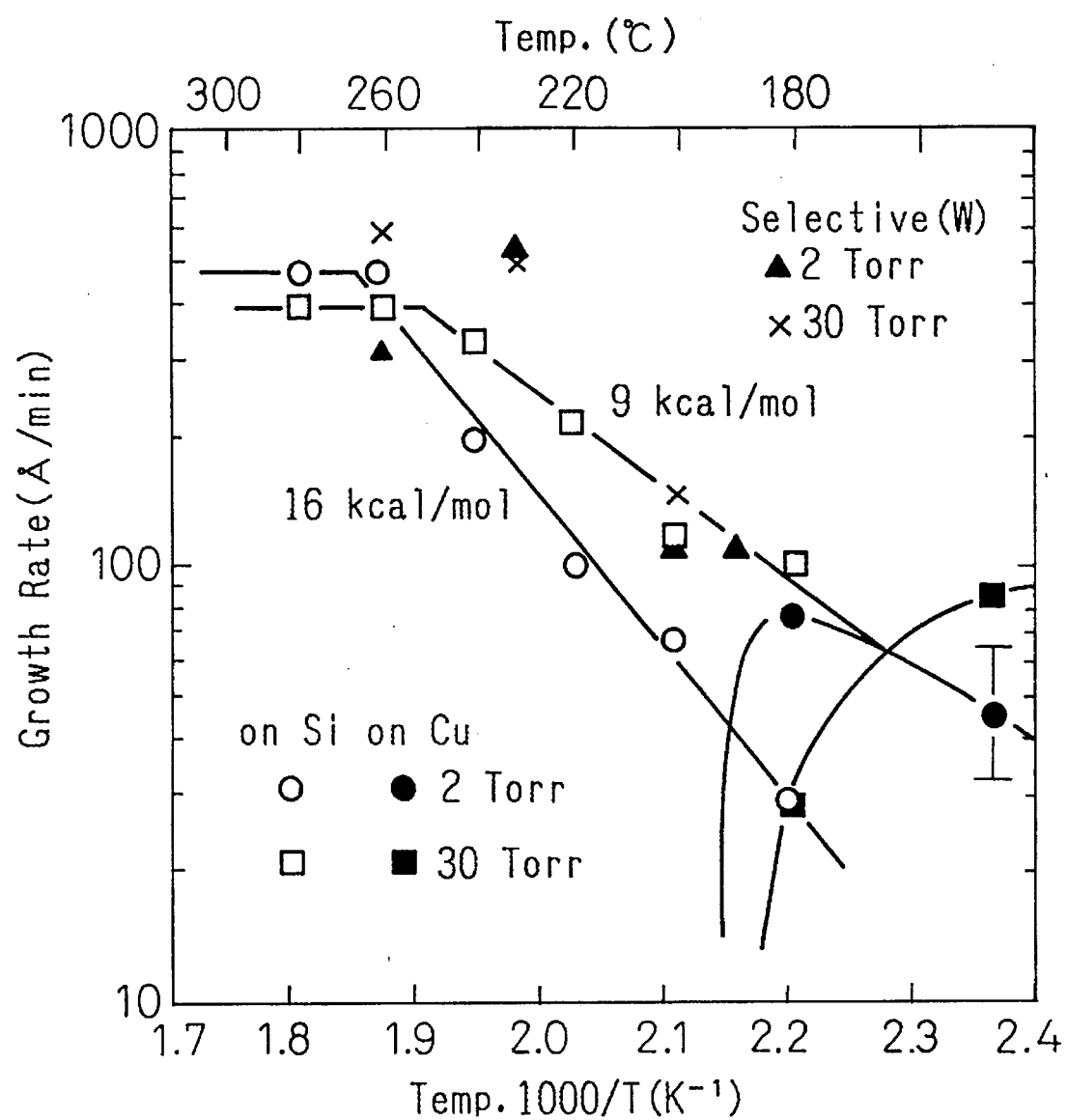
FIG. 5 shows the growth rate of a gold film grown by a process of selective area chemical vapor deposition according to the present invention, as a function of the film growing temperature.

FIG. 5 shows the growth rate of a gold film grown by a process of selective area chemical vapor deposition according to the present invention, in which the axis of abscissa represents the film growing temperature and the axis of ordinate represents the film growth rate.

In FIG. 5, the term "Selective (W)" means that a selective area made of tungsten is provided on a Si or Cu substrate.

It can be seen from FIG. 5 that, at both gas pressures of 2 Torr and 30 Torr, the selectivity between the growth rates on the copper substrate and on the silicon or tungsten substrate is significant at temperatures above about 190° C., although it is not significant at temperatures below about 180° C.

The growth rates are as high as 600 Å/min and 500 Å/min on the W substrate and on the Si substrate, respectively, which are about 20 times the growth rate of 30 Å/min achieved by the conventional process of growing an Au film on an Au substrate.

Figure 6A:
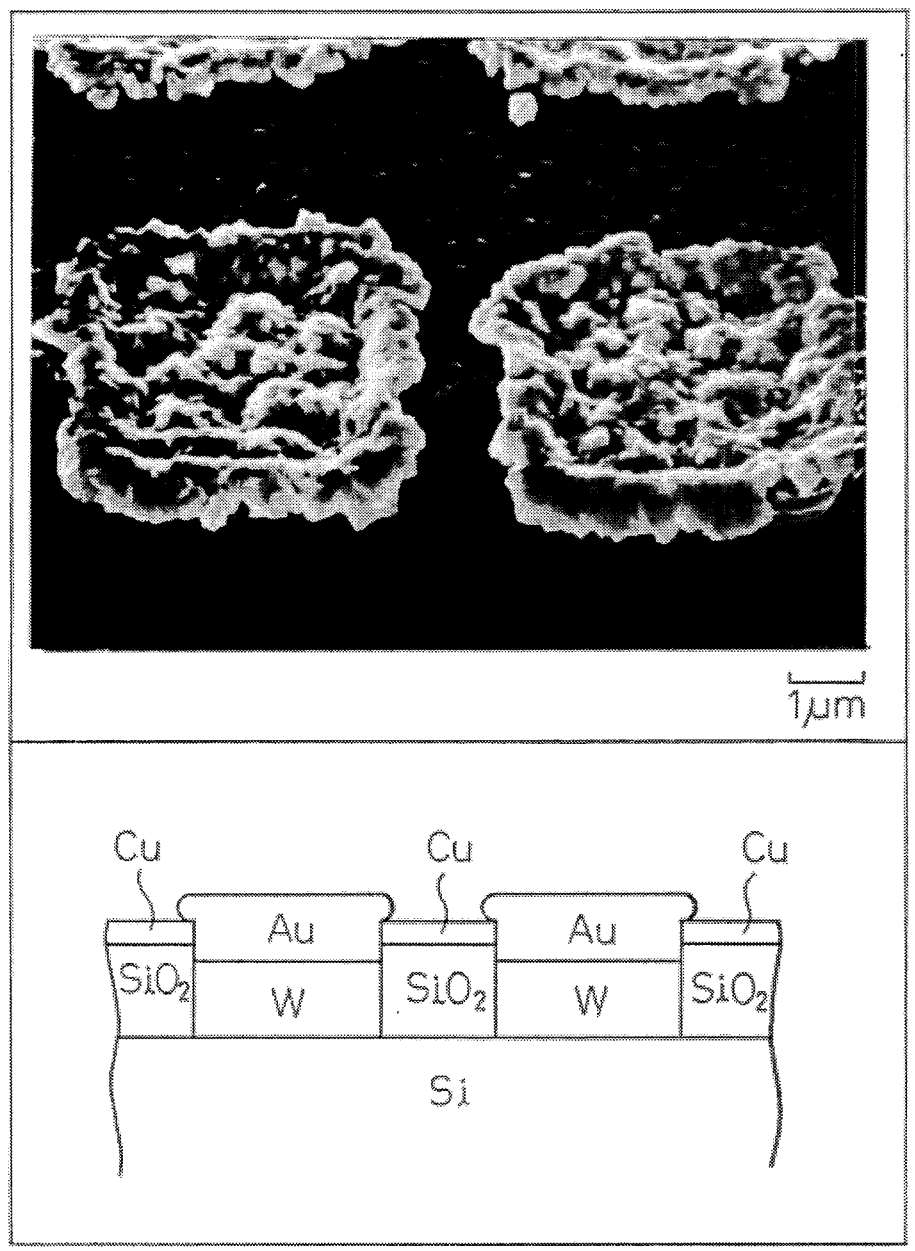
FIGS. 6A and 6B show, in the upper frames, microphotographs of Au film patterns grown by a process of selective area chemical vapor deposition according to the present invention and, in the lower frames, sketches of the cross sections of the Au film patterns.
Figure 6B:
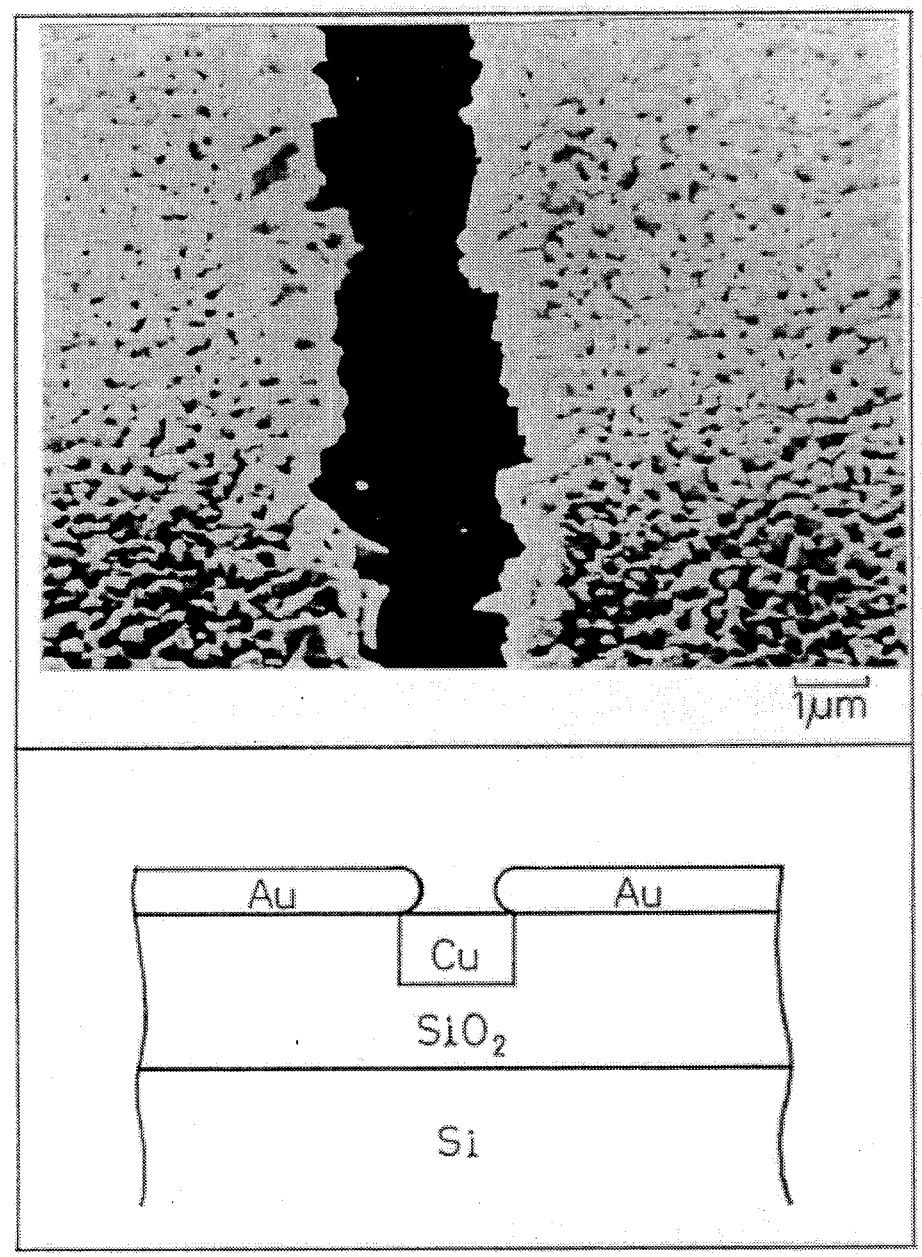

FIGS. 6A and 6B show, in the upper frames, microphotographs of Au film patterns grown by a process of selective area chemical vapor deposition according to the present invention and, in the lower frames, sketches of the cross sections of the Au film patterns.

FIG. 6A shows an Au film pattern grown by the above-described process according to the present invention, in a manner such that a W film was first formed on a Si substrate, a Cu film (dark region) having 4 μm×4 μm square openings was formed on the W film, and then the Au film was grown selectively on the W film in the portions exposed in the bottoms of the square openings of the Cu film, the Au film (bright region) extending over the side walls of the openings to the lips of the openings, as can be best seen from the sketch in the right column.

FIG. 6B shows another Au film pattern grown by the above-described process according to the present invention, in a manner such that an $SiO_2$ film was first formed on an Si substrate, 2 μm wide stripes of Cu film (dark region) were formed on the $SiO_2$ film, and then the Au film was grown selectively on the $SiO_2$ film in the portions in which the Cu stripes are not formed, the Au film (bright region) extending over the side walls of the Cu stripes to the edges of the Cu stripes, as can be best seen from the sketch in the right column.

It can be clearly seen from FIGS. 6A and 6B that Au films were not grown on the Cu film but were selectively grown only on the W and $SiO_2$ films.

Figure 7:
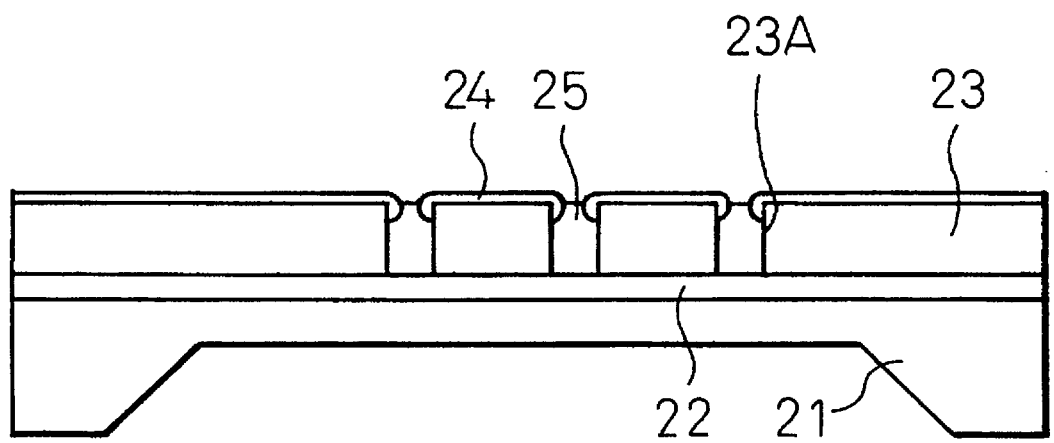
FIG. 7 shows an X-ray mask produced by a process of selective area chemical vapor deposition of metal films according to the present invention.

FIG. 7 shows a mask for X-ray exposure having an SiC substrate 21, an Si film 22, a polyimide film 23, an opening 23A, a Cu film 24, and an Au film 25, in a cross-sectional view. The SiC substrate has a membrane portion in the middle having a thickness reduced by etching on the rear side.

The mask shown in FIG. 7 is produced by a process of selective area vapor deposition of metal films according to the present invention in the following sequence.

The Si film 22, on which an Au film is easily grown by the process of the present invention, is first grown on the SiC substrate 21. The polyimide film 23 is formed on the Si film 22 and the openings 23A are then formed in the polyimide film 23 through the thickness thereof in the portions in which X-ray is shut off.

The Cu film 24 is then formed by sputtering on the polyimide film 23, specifically on the top surface of the polyimide film 23 and on the side walls of the openings 23A. The Cu film, however, is not formed on the bottoms of the openings 23A because of a shadow effect in the sputtering.

Thereafter, a process of selective area chemical vapor deposition according to the present invention is then carried out to selectively grow the Au film 25 only on the Si film 22 in the portions exposed in the openings 23A. The thus-formed Au film 25 fills the openings 23A from the bottom to the upper periphery thereof, namely it has substantially the same thickness as the polyimide film 23.

The thus-produced X-ray mask has areas provided with the Au film 25 to block X-rays and the other areas not provided with the Au film 25 to allow X-rays to pass, so that the pattern composed of the openings 23A is transferred as a reversed pattern onto a substrate on which a semiconductor integrated circuit is formed.

Figure 8A:
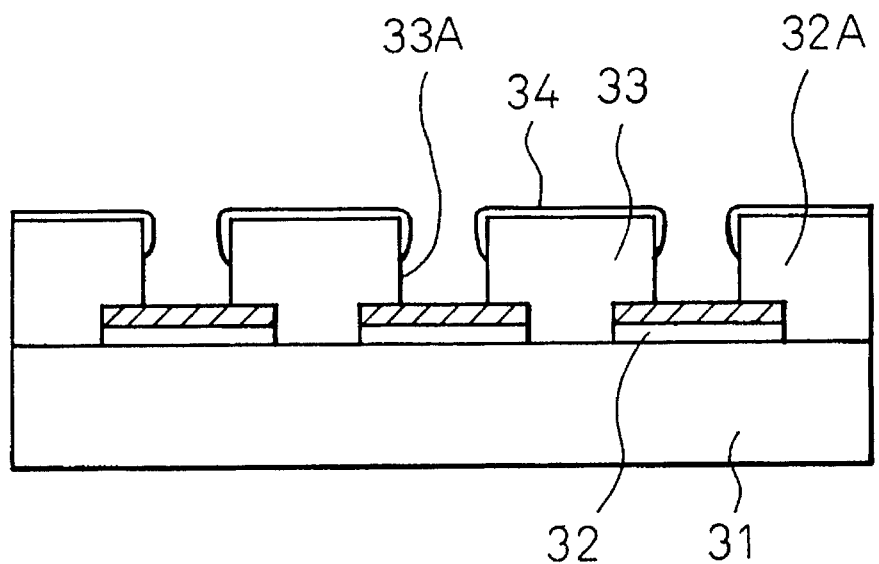
FIGS. 8A and 8B show, in cross-sectional views, process steps to form an Au film filling contact holes by a process of selective area chemical vapor deposition of metal films according to the present invention.
Figure 8B:
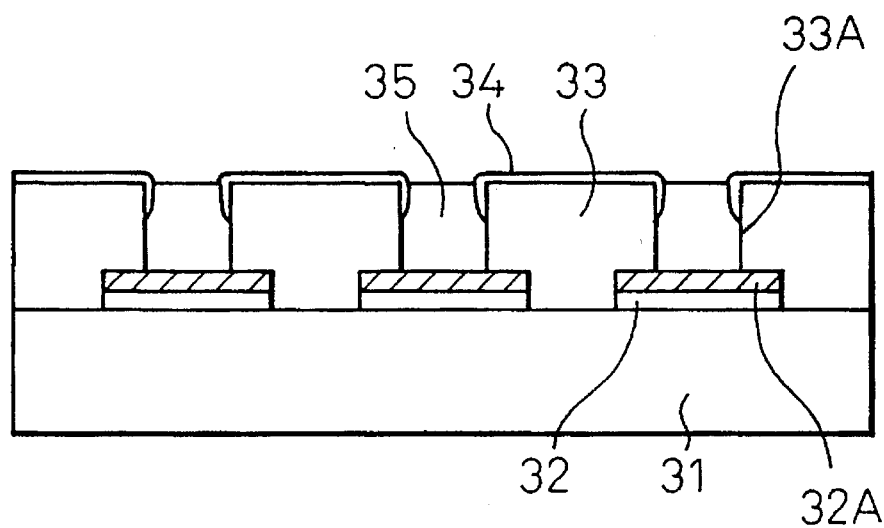

FIGS. 8A and 8B show, in cross-sectional views, process steps to form an Au film filling contact holes by a process of selective area chemical vapor deposition of metal films according to the present invention, in which symbol "31" denotes an Si substrate, "32" a tungsten (W) electrode, "32A" a TiN film, "33" an interlaminar insulating layer of $SiO_2$, "33A" a contact hole, "34" a Cu film, and "35" an Au film.

Referring to FIG. 8A, the conductor contact of the Au film 35 filling the contact holes 33A is formed by a process of selective area chemical vapor deposition of metal films according to the present invention in the following sequence.

The Si substrate is first subjected to a wafer pretreatment process. Tungsten (W) electrodes 32 and barrier metal layers of the TiN film 32A are formed sequentially in that order on the Si substrate 31. The interlaminar insulating layer of $SiO_2$ 33 is then formed over the entire substrate. Contact holes 33A are formed in the $SiO_2$ interlaminar insulating layer 33 at the positions at which the tungsten electrodes 32 are underlying.

The Cu film 34 is then formed by sputtering on the $SiO_2$ interlaminar insulating layer 33 but is not formed on the bottom surface of the contact holes 33A of the interlaminar insulating layer 33 because of a shadow effect in the sputtering.

Referring to FIG. 8B, thereafter, a process of selective area chemical vapor deposition according to the present invention is then carried out to selectively grow the Au film 35 only on the bottom surface of the contact holes 33A, the bottom surface being provided by the TiN film 32A formed on the W electrode 32. The thus-formed Au film 35 fills the contact holes 33A from the bottom to the upper periphery thereof, namely it has the top surface on substantially the same level as that of the $SiO_2$ interlaminar insulating layer 33, and thereby provides a conductor contact to the W electrodes 32.

Although the above-mentioned example refers to selective area chemical vapor deposition of an Au film, it will be readily recognized that the process according to the present invention may be advantageously applied to selective area chemical vapor deposition of films of Pt or other inactive metals.

In case of Pt films, the source may be Pt(hfa) or other compounds of Pt and the hfa radical having a high vapor pressure and the substance forming the nonselective area may be Cu.

As hereinabove described, the present invention provides a process of selective area chemical vapor deposition of metal films, in which a film of Au or other inactive metals is selectively grown in a fine submicron area at a growth rate as great as 600 Å/min, for example, which is 20 times greater than the conventional growth rate, so that the present invention makes a great contribution to the manufacture of semiconductor integrated circuits.

We claim:

1. A process of growing a film of a noble metal on a substrate in a selective area thereof by chemical vapor deposition, said process comprising the steps of:

preparing a source material having a molecule comprising a noble metal and a hexafluoroacetylacetonate radical ($C_5HF_6O_2$);

providing a substrate having a selective area made of a first substance which is unreactive with said radical and an other area made of copper which is reactive with said radical; and supplying said source material onto said substrate held at a film growing temperature to induce a reaction on said substrate, such that, in said selective area, said molecule of said source material is bonded to said first substance and decomposed to precipitate said noble metal on said first substance while, in said other area, said radical of said molecule is combined with said copper to cover said other area of said substrate with a coating which is unreactive with said molecule of said source material.

2. A process according to claim 1, wherein said metal is selected from gold and platinum.

3. A process according to claim 1, wherein said metal is gold and said source material consists of dimethyl gold hexafluoroacetylacetonate (($CH_3)_2Au(C_5HF_6O_2)$).

4. A process according to claim 1, wherein said metal is platinum and said source material consists of platinum dihexafluoroacetylacetonate ($Pt(C_5HF_6O_2)_2$).

5. A process according to claim 1, wherein said first substance, which forms said selective area of said substrate, is selected from the group consisting of gold (Au), tungsten (W), platinum (Pt), titanium (Ti), titanium nitride (TiN), silicon nitride (SiN), and silicon oxide ($SiO_2$).

* * * * *

UNITED STATES PATENT AND TRADEMARK OFFICE
CERTIFICATE OF CORRECTION

PATENT NO. : 5,589,425
DATED : December 31, 1996
INVENTOR(S) : Hoshino et al.

It is certified that error appears in the above-identified patent and that said Letters Patent is hereby corrected as shown below:

ON THE TITLE PAGE,

ITEM [73] should be changed from" Fijitsu Limited" to read:

--Fujitsu Limited--

Signed and Sealed this

Eighth Day of September, 1998

Attest:

BRUCE LEHMAN

Attesting Officer        Commissioner of Patents and Trademarks